United States Patent [19]

Kim et al.

[11] Patent Number: 5,007,023

[45] Date of Patent: Apr. 9, 1991

[54] BITLINE PRECHARGE CIRCUIT OF MULTI-SECTIONAL MEMORY ARRAY

[75] Inventors: Byeongyun Kim, Seoul; Sangki Hwang, Kyongsangbuk, both of Rep. of Korea

[73] Assignee: Samsung Electronics Co., Ltd., Suwon, Rep. of Korea

[21] Appl. No.: 348,213

[22] Filed: May 5, 1989

[30] Foreign Application Priority Data

Jul. 21, 1988 [KR] Rep. of Korea ............... 88-9163

[51] Int. Cl.$^5$ .......................... G11C 7/00; G11C 8/00
[52] U.S. Cl. .............................. 365/203; 365/230.03
[58] Field of Search ........................... 365/203, 230.03

[56] References Cited

U.S. PATENT DOCUMENTS

| | | | |
|---|---|---|---|
| 4,222,112 | 9/1980 | Clemons et al. | 365/230.03 |
| 4,554,646 | 11/1985 | Yoshimoto et al. | 365/230.03 |
| 4,592,026 | 5/1986 | Matsukawa et al. | 365/203 |
| 4,723,229 | 2/1988 | Hartgring et al. | 365/230.03 |
| 4,813,021 | 3/1989 | Kai et al. | 365/203 |
| 4,817,057 | 3/1989 | Kondo et al. | 365/203 |
| 4,823,319 | 4/1989 | Pfennings | 365/203 |
| 4,845,677 | 7/1989 | Chappell et al. | 365/203 |
| 4,858,189 | 8/1989 | Ogiue et al. | 365/203 |
| 4,928,268 | 5/1990 | Nogle et al. | 365/230.03 |
| 4,935,901 | 6/1990 | Sasaki et al. | 365/230.03 |

Primary Examiner—Stuart N. Hecker
Assistant Examiner—Michael A. Whitfield

[57] ABSTRACT

The invention relates to a bit line precharge circuit of a multi-sectional memory array in which a first set of circuits gate a section decoding signal and a main bit line precharge pulse and a second set of circuits gate the section decoding signal and a main data line precharge pulse. The resultant signals from the first and second sets of circuits are fed into respective inverter circuits and then respectively into a bit line precharge circuit and a data line precharge circuit so that the operation margin of the section decoding signal increases by as much as the width of the main bit line precharge pulse.

4 Claims, 6 Drawing Sheets

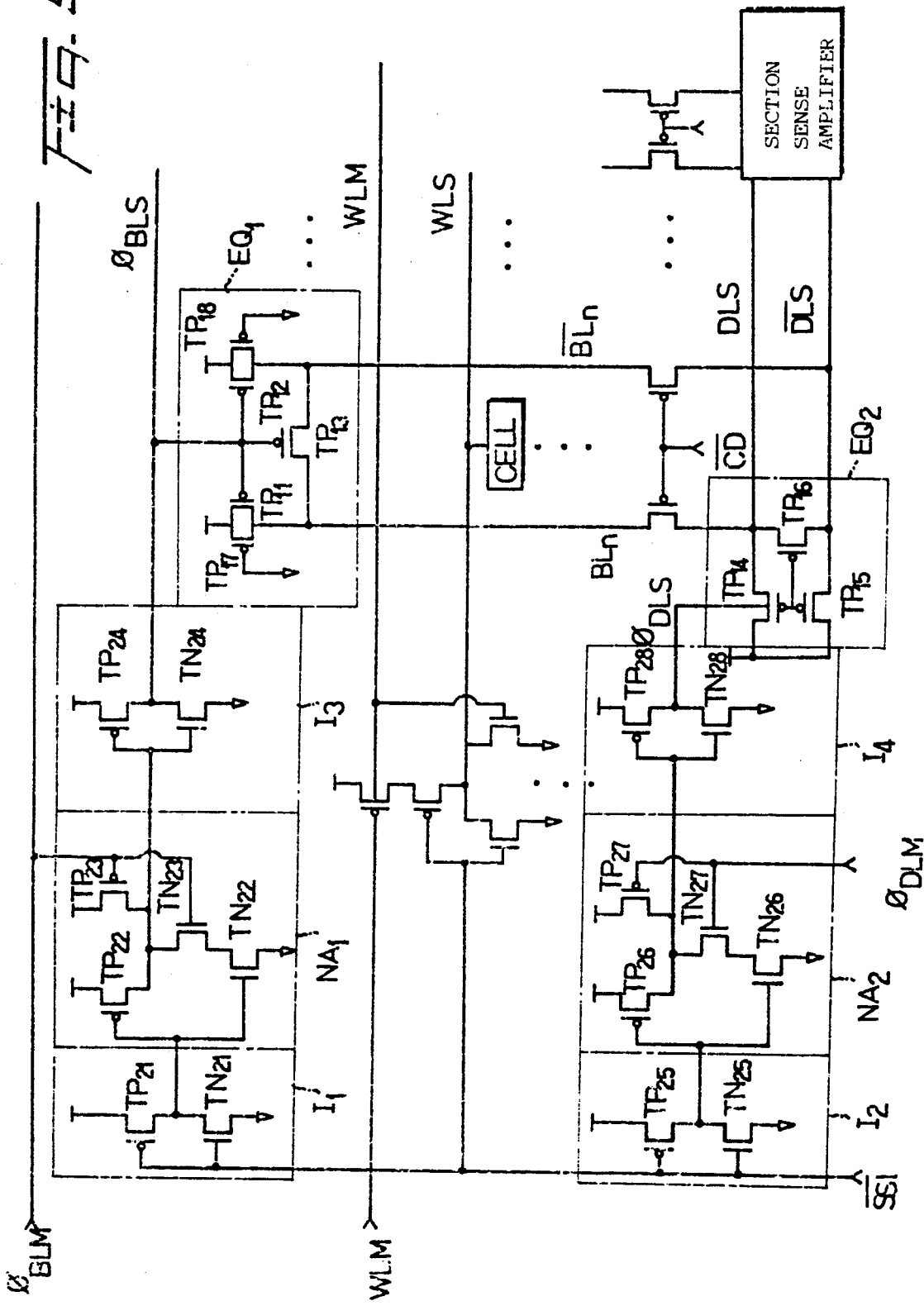

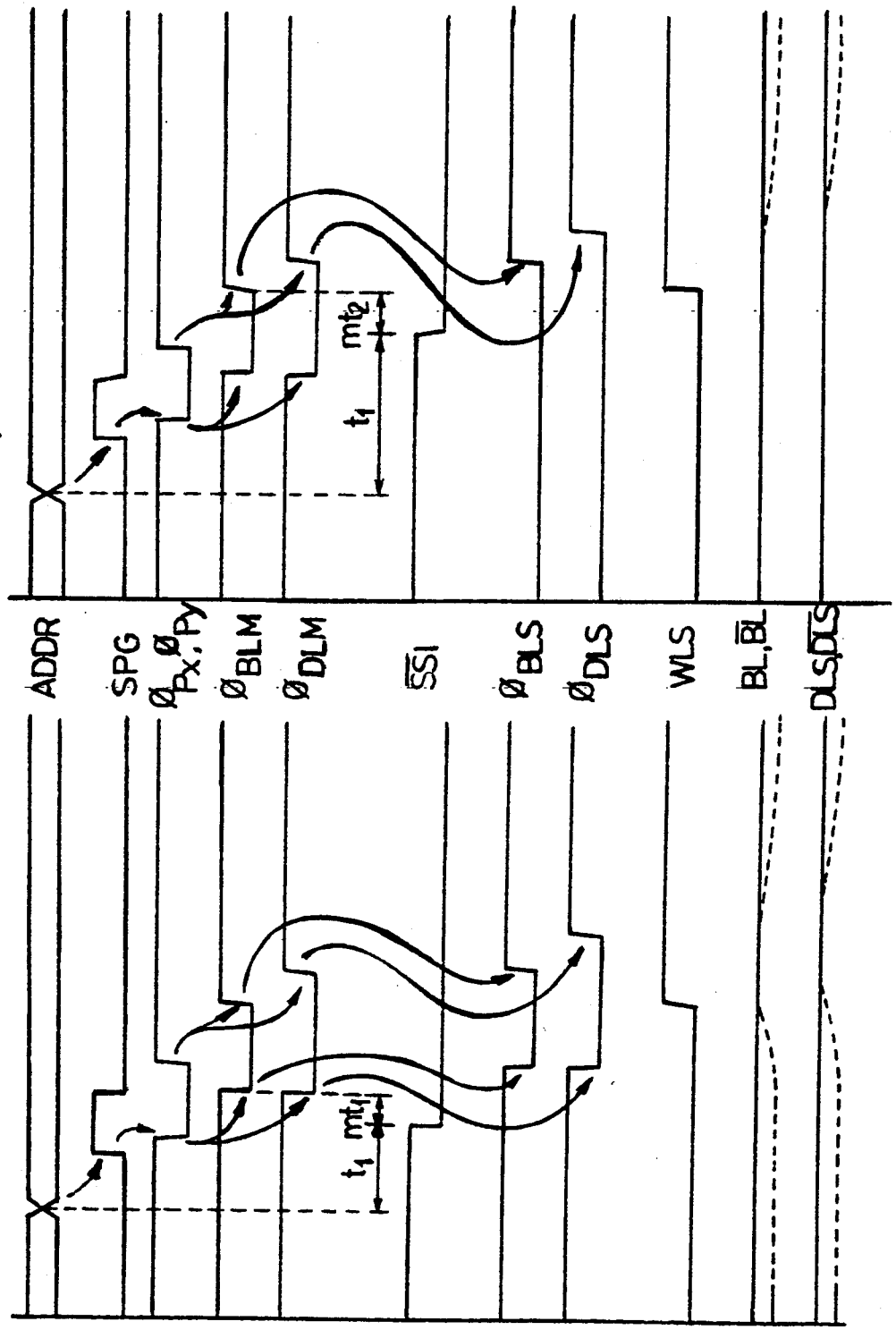

BITLINE PRECHARGE CIRCUIT OF MULTI-SECTIONAL MEMORY ARRAY

BACKGROUND OF THE INVENTION

The present invention relates to the bitline precharge circuit of a multi-sectional memory array, which improves the operating speed and also stabilizes the charge equalization operation in the multi-sectional type static RAM.

In designing the large-integrated Memory devices, the design technique of the multi-sectional memory array has been utilized and generalized to gain the operating speed and decrease the operating power consumption. FIG. 1 is a block diagram of the multi-sectional memory array. Therein the cell array is constituted by N sections($S_1$-$S_n$) and the section is selected or not selected according to the transition of a section decoding signal($\overline{SS}_L$), which is controlled by a section decoder(SD) corresponding to each section.

Also, the section word line(WLS) of each section($S_1$-$S_n$) is operated by the combination of the main word line(WLM) and the section decoding signal($\overline{SS}_L$). And the bit line precharge part(BP) is operated by the section bit line precharge pulse($\phi_{BLS}$) which is the combination of the section decoding signal($\overline{SS}_L$) and the main bit line precharge pulse($\phi_{BLM}$).

FIG. 3 is a block diagram of the circuit generating the main signals used in FIG. 1. Therein the external address signal(XAk) enters to a row address buffer(RAB) and a short pulse generator($SPG_1$), the external address signal(ZAj) enters to a section address buffer(SAB) and a short pulse generator($SPG_2$), and the external address signal($YA_i$) enters to a column address buffer(CAB) and a short pulse generator($SPG_3$).

The output of the row address buffer(RAB) and the output of the section address buffer(SAB) are combined to generate the main word line(WLM) and the section decoding signal($\overline{SS}_L$) through a row predecoder and decoder(RPD) and a section predecoder and decoder(SPD), respectively. A column predecoder and decoder(CPD) receives the output of the column address buffer(CAB) and generates the column decoding signal($CD_i$) to select a bit line. On the other hand, a $\phi_{PX}$ pulse generator($G_1$) receives the outputs($SPG_k$, $SPG_j$) of the short pulse generator($SPG_1$, $SPG_2$) and generates a $\phi_{PX}$ pulse, and a $\phi_{PY}$ pulse generator($G_2$) receives the output($SPG_i$) of the short pulse generator($SPG_3$) and generates a $\phi_{PY}$ pulse.

Finally, the $\phi_{PX}$ pulse generates to the main bit line precharge pulse ($\phi_{BLM}$) by passing through two invertors ($I_{10}$, $I_{11}$) and, the $\phi_{PX}$ pulse and the $\phi_{PY}$ pulse are greatly combined by passing ($\phi_{DLM}$) through a NOR gate($NO_{10}$) and a delay circuit($DY_{10}$) to generate then main dataline circuit ($DY_{10}$).

FIG. 2 is a circuit diagram of the conventional multi-sectional memory array, which embodies the previously described FIG. 1.

Referring to FIG. 6, the precharge operation of the circuit is as follows:

Assume that a new section is going to be accessed with a new combination of input addresses.

First, the address transition generates short pulses($SPG_k$, $SPG_j$, $SPG_i$) at $SPG_1$ or $SPG_2$ or $SPG_3$.

Soon after, the short pulses generate to the main precharge pulses $\phi_{BLM}$, $\phi_{DLM}$. On the other hand, the new combination of address inputs result in a new section decoding output.

A time, $t_1$, is defined as the delay time from the address inputs to the new output of section decoding circuit and a time, $mt_1$, is defined as the spare time from the new output of section decoding circuit to the main bit line precharge pulse, $\phi_{BLM}$.

The new section is selected by section decoding signal($\overline{SS}_L$), then main bit line and data line precharge pulses($\phi_{BLM}$, $\phi_{DLM}$) appear, so the charge and equalization are attained by the driving transistors($TP_1$-$TP_6$) of FIG. 2. At this time the bit line has been partially charged by the transistors($TN_1$, $TN_2$) in the non-selected condition, however since the transistors are usually designed to have a very small size due to read speed and operation current, the charging of the bit line by the transistors is very slow and is thus substantially negligible. Thus the said section decoding signal($\overline{SS}_L$) should respond within the shortest time from the address input and precedes the leading edge of the main bit line and data line precharge pulse($\phi_{BLM}$, $\phi_{DLM}$) with the spare time($mt_1$), to guarantee enough precharge time of bit lines and data lines. In the case where $mt_1 < 0$, depending on the surroundings, the pulse width of the said section bit line and data line precharge pulse($\phi_{BLS}$, $\phi_{DLS}$) decreases and it is difficult to sufficiently precharge the section bit line(BLS) and the section data line(DLS), so careful attention must be paid when the chip is designed. Thus, there is a problem due to the operation speed of the whole chip being limited by the section decoding signal($\overline{SS}_L$) which selects or deselects the section and the operation itself is unstable in certain instances.

SUMMARY OF THE INVENTION

It is a principal object of the present invention to offer a solution to the aforementioned problem, by providing a precharge circuit of multi-sectional memory array that improves the operation speed and stabilizes the precharge operation of the multi-sectional memory array.

In the present invention, the section decoding signal has a wider operation margin as wide as the width of the main bit line precharge pulse compared to conventional precharge circuits. This is composed that the section decoding signal inverted through the invertor circuit and main bit line precharge pulse, and section decoding signal inverted through the invertor circuit and main data line precharge pulse are combined at NAND circuit respectively, then are inputted to bit line precharge circuit and data line precharge circuit through invertor circuit respectively.

BRIEF DESCRIPTION OF THE DRAWINGS

These and other objects and advantages of the present invention will become clear from the following description with reference to the accompanying drawings, wherein;

FIG. 5 is the schematic circuit diagram of the charge equalization circuit of FIG. 4;

FIG. 6 is a timing chart of the prior art circuit of FIG. 1; and

FIG. 7 is a timing chart of the present invention.

DETAILED DESCRIPTION OF THE PREFERRED EMBODIMENT

Figure 4:
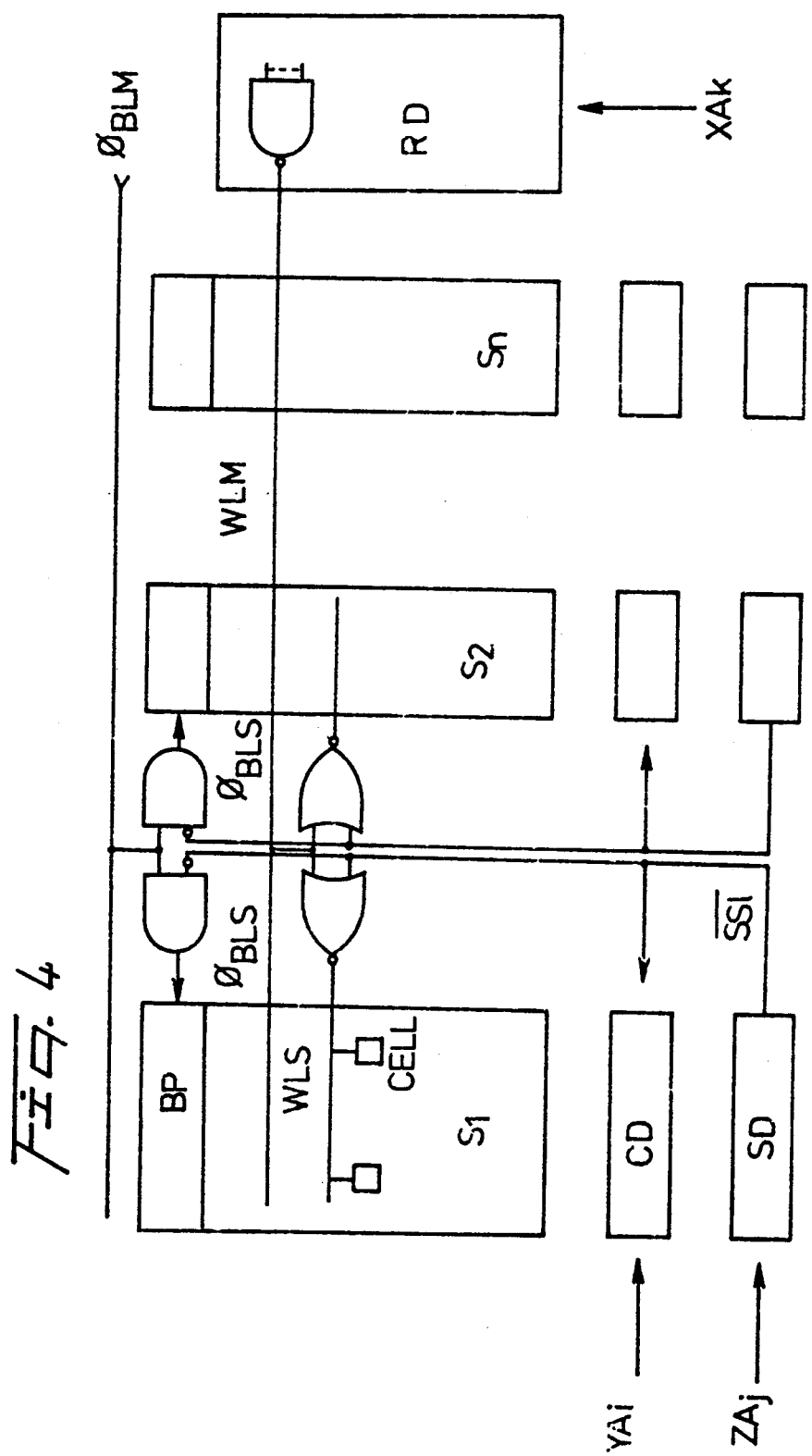
FIG. 4 is a block diagram of the memory cell array of the present invention.

According to one embodiment of the present invention attached under, the detailed description of the present invention is as follows. Referring now to the drawings, FIG. 4 is the block diagram of the present invention and the circuit diagram that embodies FIG. 4 is shown in FIG. 5.

The section decoding signal($\overline{SS}_L$) is connected as an input to each invertor circuit($I_1$, $I_2$) comprising P, N MOS transistors($TP_{21}$, $TN_{21}$) and P, N MOS transistors($TP_{25}$, $TN_{25}$).

The output of the said invertor circuit($I_1$) and of the main bit line precharge pulse($\phi_{BLM}$) are input to NAND circuit($NA_1$) comprising P, N MOS transistors($TP_{22}$, $TP_{23}$, $TN_{22}$, $TN_{23}$).

The output of the said NAND circuit($NA_1$) passes through invertor circuit ($I_3$) generating section bit line precharge pulse($\phi_{BLS}$). The invertor circuit($I_3$) comprising P, N MOS transistors($TP_{24}$, $TN_{24}$) and is inputted to each bit line precharge circuit($EQ_1$). The bit line precharge circuit ($EQ_1$) comprises P MOS transistors($TP_{11}$-$TP_{13}$, $TP_{17}$, $TP_{18}$).

On the other hand, the section decoding signal($\overline{SS}_L$) is inverted by passing through invertor circuit($I_2$) and then is gatedly combined with the main data line precharge pulse($\phi_{DLM}$) at NAND circuit($NA_2$) NAND circuit ($NA_2$) comprises P, N MOS transistors($TP_{26}$, $TP_{27}$, $TN_{26}$, $TN_{27}$), and passes through the invertor circuit($I_4$) which comprises P, N MOS transistors($TP_{28}$, $TN_{28}$), and then is inputted to section data line precharge circuit($EQ_2$) which comprises P MOS transistors($TP_{14}$-$TP_{16}$).

Referring now to the timing chart of FIG. 7, the description of the present invention is as follows.

Figure 1:
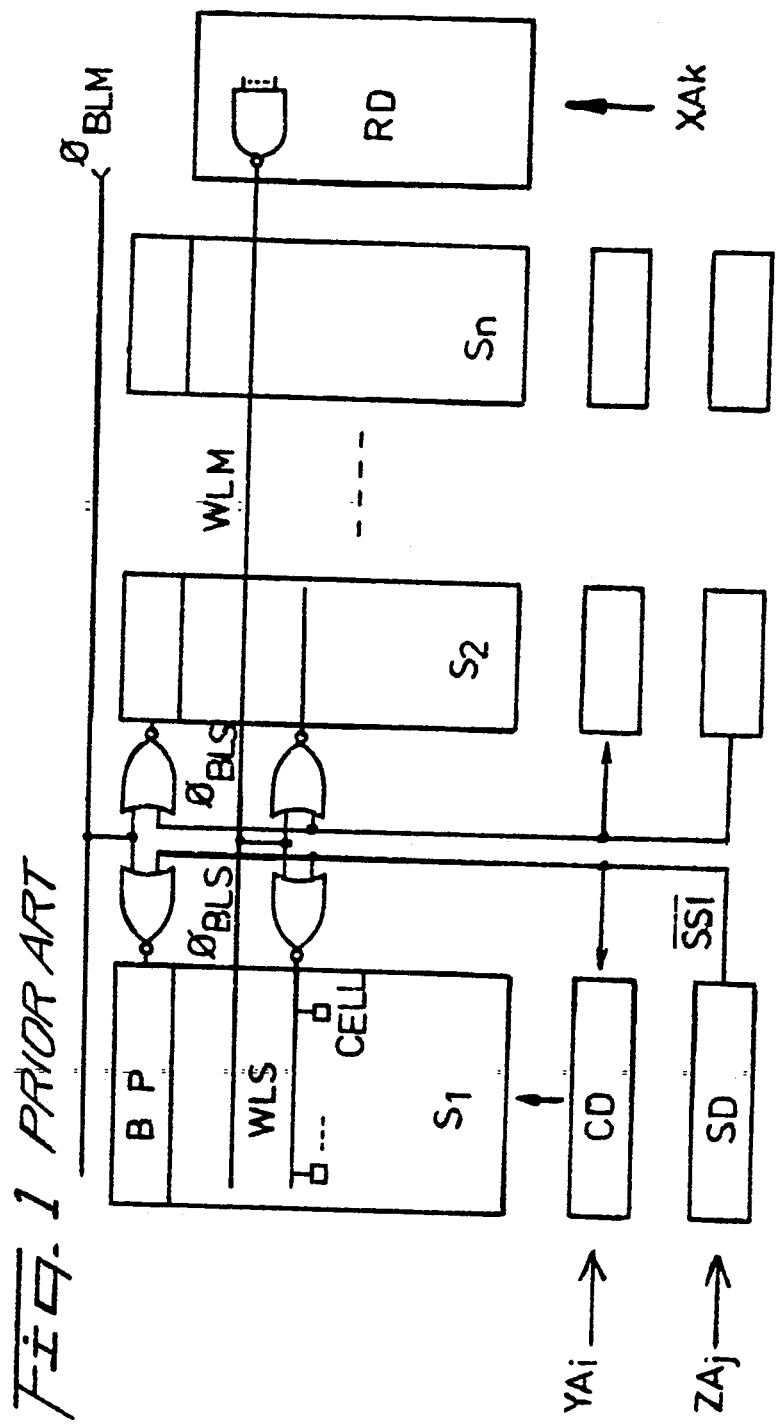
FIG. 1 is a block diagram of a prior art memory cell array.
Figure 2:
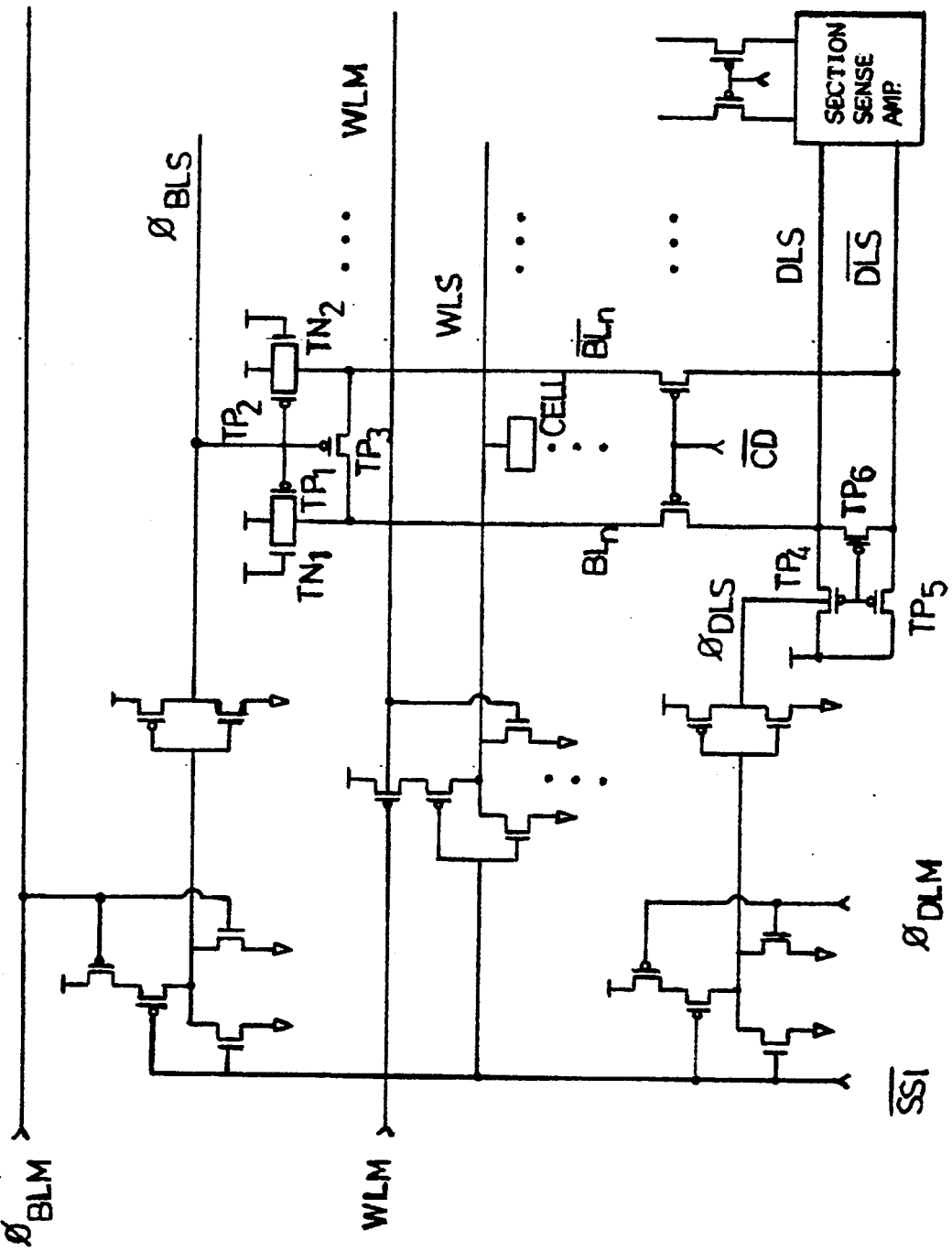
FIG. 2 is the schematic circuit diagram of the charge equalization circuit of FIG. 1.
Figure 3:
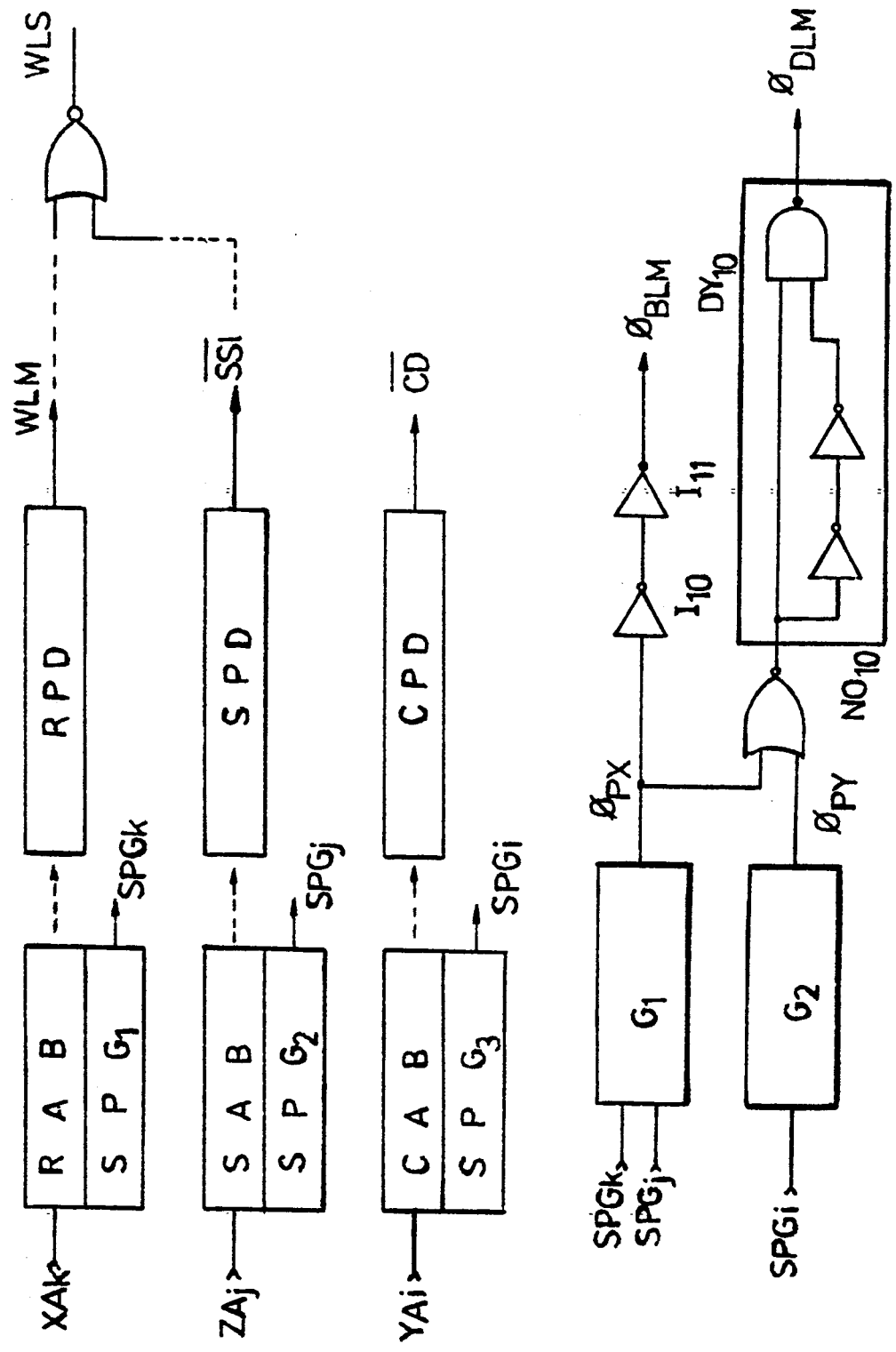
FIG. 3 is the control signal generating circuit of a multi-sectional memory cell of FIG. 1.

In the case where there is no change of address, the output signals(SPGk, SPGj, SPGi) of short pulse generators($SPG_1$-$SPG_3$) of FIG. 3 stay in there normal state, thus the $\phi_{PX}$, $\phi_{PY}$ signals that are the output of the $\phi_{PX}$, $\phi_{PY}$ signal generators($G_1$, $G_2$) are at high levels.

The said $\phi_{PX}$ signal is inverted at the invertor circuits-($I_{10}$, $I_{11}$) and is outputted to the main bit line precharge pulse($\phi_{BLM}$) at a high level, the said $\phi_{PX}$ and $\phi_{PY}$ signals are also combined at NOR gate($NO_{10}$) and pass through the delay circuit($DY_{10}$), then are outputted to the main data line precharge pulse($\phi_{DLM}$) at a high level.

On the other hand, the section decoding signal($\overline{SS}_L$) of the section predecoder and decoder(SPD) that is not selected has a high level output.

Consequently the section bit line precharge pulse($\phi_{BLS}$) and section data line precharge pulse($\phi_{DLS}$) maintain low levels and the charge equalization occurs at the bit line(BL/$\overline{BL}$) and the section data line(DL/$\overline{DL}$).

Thus, the charge equalization starts from the time the relevant section is not selected.

After that, if the address(ADDR) changes and the short pulses are generated at the short pulse generators($SPG_1$-$SPG_3$), then $\phi_{PX}$, $\phi_{PY}$ signals are generated accordingly. After the constant time delays at the trailing edge of the said $\phi_{PX}$, $\phi_{PY}$ signals, main bit line and data line precharge pulses($\phi_{BLM}$, $\phi_{DLM}$) are outputted at a low level.

On the other hand, after a time(ti) from the input of the address(ADDR), the section decoding signal($\overline{SS}_L$) has a low level output, this is designed to occur at a later time than when the main bit line and data line precharge pulses($\phi_{BLM}$, $\phi_{DLM}$) are at a low level.

Thus, if the address changes and the main bit line precharge pulse($\phi_{BLM}$) goes to a low level, P MOS transistor($TP_{23}$) of NAND circuit($NA_1$) turns on and N MOS transistor($TN_{23}$) turns off. At this time the section decoding signal($\overline{SS}_L$) is at a high level, thus the P MOS transistor($TP_{22}$) is turned on and the N MOS transistor($TN_{22}$) is turned off by the invertor circuit($I_1$).

Accordingly the high level received at the NAND circuit($NA_1$) is inverted at the invertor circuit($I_3$) and the section bit line precharge pulse($\phi_{BLS}$) remains at a low level which is its prior state.

The section data line precharge pulse($\phi_{DLS}$) also remains at its low level state by the NAND circuit($NA_2$) and invertor circuits($I_2$, $I_4$) with the same constitution as the above-mentioned case.

Thereafter if the section decoding signal($\overline{SS}_L$) goes to a low level after the time($t_1$) elapses from the address input, N MOS transistors($TN_{22}$, $TN_{26}$) of each NAND circuit($NA_1$, $NA_2$) turn on respectively, but the N MOS transistors($TN_{23}$, $TN_{27}$) remain in an off state continuously, thus the main bit line and data line precharge pulses($\phi_{BLM}$, $\phi_{DLM}$) do not change.

But, after the time($mt_2$) elapses from the trailing edge of the said section decoding signal($\overline{SS}_L$) the main bit line precharge pulse goes to a high level and turns the N MOS transistor($TN_{23}$) of NAND circuit($NA_1$) on, thus the output of NAND circuit($NA_1$) goes to a low level and the section bit line precharge pulse($\phi_{BLS}$) goes to a high level accordingly. Here the time($mt_2$) is the spare time.

The operation of the NAND circuit($NA_2$) operates the same as the said NAND circuit($NA_1$) by the main data line precharge pulse($\phi_{DLM}$) going to a high level a little later than the main bit line precharge pulse($\phi_{BLM}$), and then the section data line precharge pulse($\phi_{DLS}$) also goes to a high level.

Therefore the P MOS transistors($TP_{11}$-$TP_{13}$) of the bit line precharge circuit($EQ_1$) and P MOS transistors($TP_{14}$-$TP_{16}$) of the section data line precharge circuit($EQ_2$) finish the charge equalization operation and perform the next operation.

As mentioned above, the charge equalization of the section data line(DLS) and section bit line(BLS) start from the time a certain section is not selected by the section decoding signal, the time the section is selected again the charge equalization is already sufficiently attained. On the other hand, the decoding signal of the relevant section is designed to have a spare time($mt_2$) for the trailing edge of the main bit line and data line precharge pulses. Therefore the wider operation margin of the said section decoding signal is as wide as the width of the main bit line precharge pulse compared with the previous design method that standardizes the leading. That is, it is able to improve the speed.

Accordingly the charge equalization of the bit line(BL) and data line(DL) is perfected, and the stability is endowed with the operation of the chip and there is an effect that improves the operation speed.

What is claimed is:

1. A bit line precharge circuit of a multi-sectional memory array, comprising:

first and second invertor circuits adapted to receive and invert a section decoding signal applied thereto;

a first NAND circuit adapted to receive and to NAND-gate the inverted section decoding signal from said first invertor circuit and a main bit line precharge pulse applied thereto;

a second NAND circuit adapted to receive and to NAND gate the inverted section decoding signal from said second invertor circuit and a main data line precharge pulse applied thereto;

third and fourth invertor circuits adapted to receive and to invert outputs from said first and second NAND circuits, respectively;

the bit line precharge circuit being adapted to receive an output of said third invertor circuit and a data line precharge circuit adapted to receive an output from said fourth invertor circuit so that the operation margin of said section decoding signal increases by as much as the width of said main bitline precharge pulse.

2. A bit line precharge circuit of a multi-sectional memory array as claimed in claim 1 wherein said first NAND circuit includes first and second P,N MOS transistors, said first P,N MOS transistors having respective gates coupled together to receive said inverted section decoding signal from said first invertor, said second P,N MOS transistors have respective gates coupled together to receive said main bit line precharge pulse, said first and second P MOS transistors, connected in parallel and having output terminals, and said first and second N MOS transistors connected in series and having output terminals; and said second NAND circuit includes third and fourth P,N MOS transistors, said third P,N MOS transistors having their respective gates coupled to receive said inverted section decoding signal from said second invertor, said fourth P,N MOS transistors having their respective gates coupled to receive said main data line precharge pulse, said third and fourth P MOS transistors having output terminals and being connected in parallel, and third and fourth N MOS transistors having output terminals and being connected in series.

3. A bit line precharge circuit of a multi-sectional memory array as claimed in claim 1 wherein a section bit line precharge pulse is gated through said first NAND circuit and then said third invertor and then input to said bit line precharge circuit, said bit line precharge circuit including a set of three P MOS transistors having their respective gates coupled together and through which an inputted signal for said third invertor is connected.

4. A bit line precharge circuit of a multi-sectional memory array as claimed in claim 1 wherein a non-selected section of said memory array has bit lines which are charge equalized and precharged in response to said section decoding signal.

* * * * *